(12) United States Patent
Jin et al.

(10) Patent No.: US 11,004,526 B2
(45) Date of Patent: May 11, 2021

(54) SHIFT REGISTER, GATE DRIVE CIRCUIT AND DISPLAY PANEL

(71) Applicant: Shanghai AVIC OPTO Electronics Co., Ltd., Shanghai (CN)

(72) Inventors: Huijun Jin, Shanghai (CN); Dandan Qin, Shanghai (CN); Shoufu Jian, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/861,238

(22) Filed: Apr. 29, 2020

(65) Prior Publication Data

US 2020/0258586 A1    Aug. 13, 2020

(30) Foreign Application Priority Data

Oct. 29, 2019    (CN) .......................... 201911040444.7

(51) Int. Cl.
  *G11C 19/28*    (2006.01)
  *G09G 3/36*    (2006.01)
  *G09G 3/20*    (2006.01)

(52) U.S. Cl.
  CPC ........... *G11C 19/28* (2013.01); *G09G 3/2092* (2013.01); *G09G 3/3677* (2013.01); *G09G 2310/0286* (2013.01); *G09G 2310/0289* (2013.01); *G09G 2330/021* (2013.01)

(58) Field of Classification Search
  CPC ............... G09G 3/2092; G09G 3/3677; G09G 2310/0286; G09G 2310/0289; G09G 2330/021; G11C 19/28
  See application file for complete search history.

(56) References Cited

U.S. PATENT DOCUMENTS

| 9,972,238 B2 * | 5/2018 | Li | G09G 3/3266 |
| 2019/0392916 A1 * | 12/2019 | Gu | G11C 19/287 |
| 2020/0051655 A1 * | 2/2020 | Dong | G09G 3/3266 |
| 2020/0335056 A1 * | 10/2020 | Feng | G09G 3/3677 |

FOREIGN PATENT DOCUMENTS

| CN | 104810058 A | 7/2015 |
| CN | 108364601 A | 8/2018 |

* cited by examiner

*Primary Examiner* — Patrick O'Neil
(74) *Attorney, Agent, or Firm* — Kilpatrick Townsend & Stockton, LLP

(57) ABSTRACT

Provided are a shift register, a gate drive circuit and a display panel. The shift register includes a reset module, where a first control terminal of the reset module is electrically connected to a first reset-signal input terminal, a second control terminal of the reset module is electrically connected to a second reset-signal input terminal, an input terminal of the reset module is electrically connected to a second power-signal input terminal, a first output terminal of the reset module is electrically connected to a first node, and a second output terminal of the reset module is electrically connected to a scanning-signal output terminal. In the third phase, the potential of the first node P is at a second level, each of potentials of the first control terminal and the second control terminal of the reset module is at the second level.

15 Claims, 9 Drawing Sheets

SHIFT REGISTER, GATE DRIVE CIRCUIT AND DISPLAY PANEL

CROSS-REFERENCES TO RELATED APPLICATIONS

This application claims the priority to a Chinese patent application No. CN 201911040444.7 filed at the CNIPA on Oct. 29, 2019, disclosure of which is incorporated herein by reference in its entirety.

FIELD

Embodiments of the present disclosure relate to display techniques and, in particular, to a shift register, a gate drive circuit and a display panel.

BACKGROUND

A liquid crystal display panel generally includes an array substrate, a color filter substrate, and a liquid crystal disposed between the array substrate and the color filter substrate. The array substrate includes multiple shift registers for providing scanning signals to the liquid crystal. When a leakage current exists in a shift register, the leakage current increases the power consumption of the shift register, increasing the power consumption of the liquid crystal display panel.

SUMMARY

The present disclosure provides a shift register, a gate drive circuit and a display panel, to reduce a leakage current of the shift register, reducing the power consumption of the shift register.

One embodiment of the present disclosure provides a shift register. The shift register includes a first control-signal input terminal, a second control-signal input terminal, a first potential-signal input terminal, a second potential-signal input terminal, a first node, a second node, a first power-signal input terminal, a second power-signal input terminal, a clock-signal input terminal, a first reset-signal input terminal, a second reset-signal input terminal, a scanning-signal output terminal, a first node control module, a voltage division module, an output module, a second node control module, a storage module and a reset module.

The first node control module includes a first control terminal, a second control terminal, a first input terminal, a second input terminal and an output terminal. The first control terminal of the first node control module is electrically connected to the first control-signal input terminal, the second control terminal of the first node control module is electrically connected to the second control-signal input terminal, the first input terminal of the first node control module is electrically connected to the first potential-signal input terminal, the second input terminal of the first node control module is electrically connected to the second potential-signal input terminal, and the output terminal of the first node control module is electrically connected to the first node. The first node control module is configured to control the first input terminal of the first node control module to communicate with the output terminal of the first node control module according to a signal inputted to the first control terminal of the first node control module, or to control the second input terminal of the first node control module to communicate with the output terminal of the first node control module according to a signal inputted to the second control terminal of the first node control module.

The voltage division module includes a first input terminal, a second input terminal, a control terminal and an output terminal. The first input terminal is electrically connected to the first power-signal input terminal, the second input terminal is electrically connected to the second power-signal input terminal, the control terminal of the voltage division module is electrically connected to the first node, and the output terminal is electrically connected to the second node. The voltage division module is configured to control a voltage of the second node to be a divided voltage of a voltage deference between a first power signal inputted to the first power-signal input terminal and a second power signal inputted to the second power-signal input terminal.

The output module includes a first control terminal, a second control terminal, a first input terminal, a second input terminal and an output terminal. The first control terminal of the output module is electrically connected to the first node, the second control terminal of the output module is electrically connected to the second node, the first input terminal of the output module is electrically connected to the clock-signal input terminal, the second input terminal of the output module is electrically connected to the second power-signal input terminal, and the output terminal of the output module is electrically connected to the scanning-signal output terminal. The output module is configured to output a signal of the clock-signal input terminal according to a potential of the first node, or to output a signal of the second power-signal input terminal according to a potential of the second node.

The second node control module includes a control terminal, an input terminal and an output terminal. The output terminal of the second node control module is electrically connected to the first node, the input terminal of the second node control module is electrically connected to the second power-signal input terminal, and the control terminal of the second node control module is electrically connected to the second node. The second node control module is configured to control the potential of the first node according to the potential of the second node.

The storage module includes a first terminal and a second terminal. The first terminal of the storage module is electrically connected to the first node, and the second terminal of the storage module is electrically connected to the scanning-signal output terminal. The storage module is configured to maintain potentials of the first node and the scanning-signal output terminal in a stable state.

The reset module includes a first control terminal, a second control terminal, an input terminal, a first output terminal and a second output terminal. The first control terminal of the reset module is electrically connected to the first reset-signal input terminal, the second control terminal of the reset module is electrically connected to the second reset-signal input terminal, the input terminal of the reset module is electrically connected to the second power-signal input terminal, the first output terminal of the reset module is electrically connected to the first node, and the second output terminal of the reset module is electrically connected to the scanning-signal output terminal. The reset module is configured to reset the first node and the scanning-signal output terminal.

One embodiment of the present disclosure further provides a gate drive circuit. The gate drive circuit includes cascaded shift registers of any embodiment of the present disclosure.

The first control-signal input terminal of the first-stage shift register is electrically connected to an initial-signal input terminal of the gate drive circuit, and the scanning-signal output terminal of the previous-stage shift register is electrically connected to the first control-signal input terminal of the next-stage shift register, and the scanning-signal output terminal of the next-stage shift register is electrically connected to the second control-signal input terminal of the previous-stage shift register.

One embodiment of the present disclosure further provides a display device. The display device includes the gate drive circuit of any embodiment of the present disclosure.

Embodiments of the present disclosure provide the reset module is disposed in the shift register. The first control terminal of the reset module is electrically connected to the first reset-signal input terminal, the second control terminal of the reset module is electrically connected to the second reset-signal input terminal, the input terminal of the reset module is electrically connected to the second power-signal input terminal, the first output terminal of the reset module is electrically connected to the first node, and the second output terminal of the reset module is electrically connected to the scanning-signal output terminal. The reset module is configured to reset the first node and the scanning-signal output terminal. In the third phase, the potential of the first node P is at a second level equal to the potential of a second level signal of the second power-signal input terminal, potentials of the first control terminal and the second control terminal of the reset module are each at the second level equal to the potential of the input terminal of the reset module. Therefore, in the third phase, the first control terminal, the second control terminal, the input terminal, the first output terminal and the second output terminal of the reset module have the same potential so that the reset module can be prevented from generating a leakage current, reducing the power consumption of the shift register.

DETAILED DESCRIPTION

Figure 1:
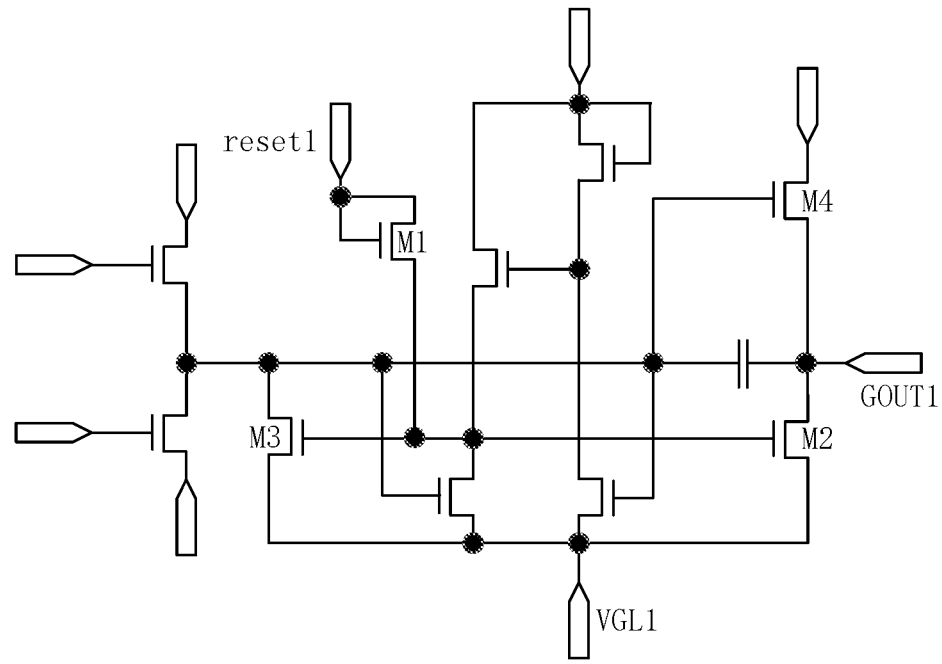
FIG. 1 is a schematic diagram of a shift register.

Hereinafter the present disclosure will be further described in detail in conjunction with the drawings and embodiments. It is to be understood that the embodiments set forth below are intended to illustrate and not to limit the present disclosure. Additionally, it is to be noted that, for ease of description, only part, not all, of the structures related to the present disclosure are illustrated in the drawings.

FIG. 1 is a schematic diagram of a shift register. As shown in FIG. 1, the shift register includes a reset transistor M1, the gate and a first electrode of the reset transistor M1 are electrically connected to a reset-signal input terminal reset1, and a second electrode of the reset transistor M1 is connected to the gate of a first output transistor M2 and the gate of a node control transistor M3. First electrodes of the first output transistor M2 and the node control transistor M3 are electrically connected to a low-level-signal input terminal VGL1, and a second electrode of the first output transistor M2 is electrically connected to an output terminal GOUT1 of the shift register, and a second electrode of the node control transistor M3 is electrically connected to the gate of a second output transistor M4. In a reset phase, a logic high level is inputted to the reset-signal input terminal reset1, the reset transistor M1 is turned on and controls the first output transistor M2 and the node control transistor M3 to turn on. Then, the first output transistor M2 outputs a logic low-level signal, which is inputted to the low-level-signal input terminal VGL1, to the output terminal GOUT1 of the shift register, resetting the output terminal GOUT1 of the shift register. Meanwhile, the node control transistor M3 outputs the logic low-level signal, which is inputted to the low-level-signal input terminal VGL1, to the gate of the second output transistor M4, to reset the gate of the second output transistor M4. During the operating process of the shift register, the reset phase costs relatively short time. In other phases, a reset signal is at a logic low level and control the reset transistor M1 to turn off. At this time, the logic low-level signal is inputted into each of the gate and the first electrode of the reset transistor M1. The potential of the first electrode of the node control transistor M3 is the potential of the logic low-level signal inputted to the low-level-signal input terminal VGL1. The potential of a second electrode of the reset transistor M1 is the potential difference between the gate and the first electrode of the node control transistor M3, and is thus greater than the logic low-level signal inputted to the low-level-signal input terminal VGL1. That is, a potential difference exists between the first electrode and the second electrode of the reset transistor M1 and forms a leakage current, increasing the power consumption of the shift register.

Figure 2:
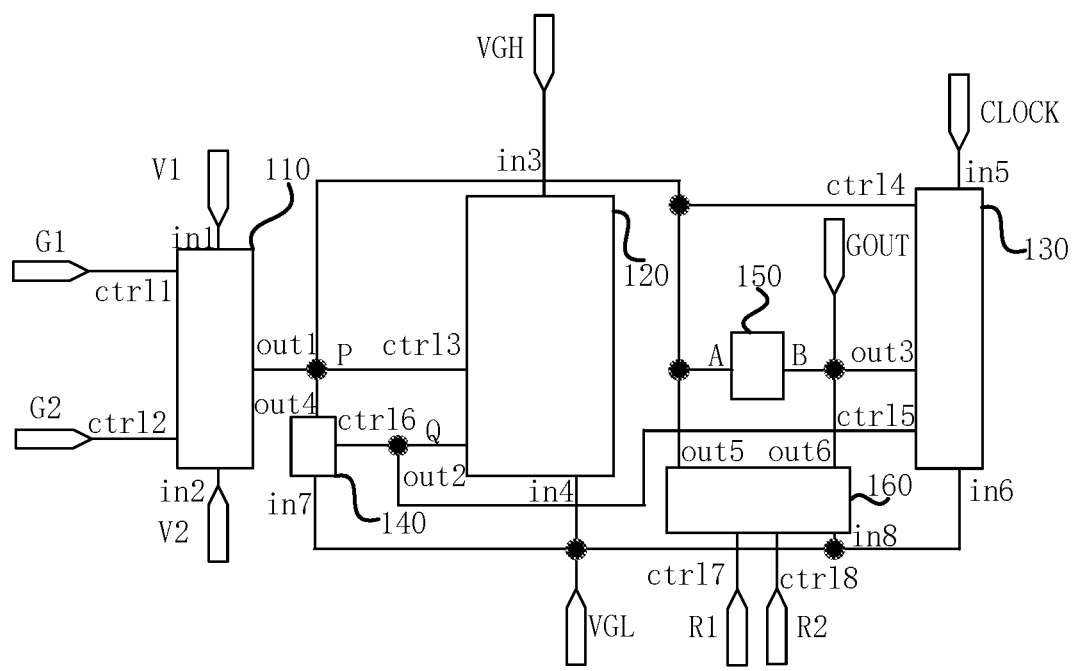
FIG. 2 is a structural diagram of a shift register according to an embodiment of the present disclosure.

FIG. 2 is a structural diagram of a shift register according to an embodiment of the present disclosure. As shown in FIG. 2, the shift register includes a first control-signal input terminal G1, a second control-signal input terminal G2, a first potential-signal input terminal V1, a second potential-signal input terminal V2, a first node P, a second node P, a first power-signal input terminal VGH, a second power-signal input terminal VGL, a clock-signal input terminal CLOCK, a first reset-signal input terminal R1, a second reset-signal input terminal R2, a scanning-signal output terminal GOUT, a first node control module 110, a voltage division module 120, an output module 130, a second node control module 140, a storage module 150 and a reset module 160. The first node control module 110 includes a first control terminal ctrl1, a second control terminal ctrl2, a first input terminal in1, a second input terminal in2 and an output terminal out1. The first control terminal ctrl1 of the first node control module 110 is electrically connected to the first control-signal input terminal G1, the second control terminal ctrl2 of the first node control module 110 is electrically connected to the second control-signal input terminal G2, the first input terminal in1 of the first node control module 110 is electrically connected to the first potential-signal input terminal V1, the second input terminal in2 of the first node control module 110 is electrically connected to the second potential-signal input terminal V2, and the output terminal out1 of the first node control module 110 is electrically connected to the first node P. The first node control module 110 is configured to control the first input terminal in1 of the first node control module 110 to be connected to the output terminal out1 of the first node control module 110 according to a signal inputted to the first control terminal ctrl1 of the first node control module 110, or to control the second input terminal in2 of the first node control module 110 to be connected to the output terminal out1 of the first node control module 110 according to a signal inputted to the second control terminal ctrl2 of the first node control module 110. The voltage division module 120 includes a first input terminal in3, a second input terminal in4, a control terminal ctrl3 and an output terminal out2. The first input terminal in3 is electrically connected to the first power-signal input terminal VGH, the second input terminal in4 is electrically connected to the second power-signal input terminal VGL, the control terminal ctrl3 of the voltage division module 120 is electrically connected to the first node P, and the output terminal out2 is electrically connected to the second node Q. The voltage division module 120 is configured to control a voltage of the second node Q to be a divided voltage of the voltage deference between a first power signal inputted to the first power-signal input terminal VGH and a second power signal inputted to the second power-signal input terminal VGL. The output module 130 includes a first control terminal ctrl4, a second control terminal ctrl5, a first input terminal in5, a second input terminal in6 and an output terminal out3. The first control terminal ctrl4 of the output module 130 is electrically connected to the first node P, the second control terminal ctrl5 of the output module 130 is electrically connected to the second node Q, the first input terminal in5 of the output module 130 is electrically connected to the clock-signal input terminal CLOCK, the second input terminal in6 of the output module 130 is electrically connected to the second power-signal input terminal VGL, and the output terminal out3 of the output module 130 is electrically connected to the scanning-signal output terminal GOUT. The output module 130 is configured to output a signal of the clock-signal input terminal CLOCK according to a potential of the first node P, or to output a signal of the second power-signal input terminal VGL according to a potential of the second node Q. The second node control module 140 includes a control terminal ctrl6, an input terminal in7 and an output terminal out4. The output terminal out4 of the second node control module 140 is electrically connected to the first node P, the input terminal in7 of the second node control module 140 is electrically connected to the second power-signal input terminal VGL, and the control terminal ctrl6 of the second node control module 140 is electrically connected to the second node Q. The second node control module 140 is configured to control the potential of the first node P according to the potential of the second node Q. The storage module 150 includes a first terminal A and a second terminal B. The first terminal A of the storage module 150 is electrically connected to the first node P, and the second terminal B of the storage module 150 is electrically connected to the scanning-signal output terminal GOUT. The storage module 150 is configured to maintain potentials of the first node P and the scanning-signal output terminal GOUT. The reset module 160 includes a first control terminal ctrl7, a second control terminal ctrl8, an input terminal in8, a first output terminal out5 and a second output terminal out6. The first control terminal ctrl7 of the reset module 160 is electrically connected to the first reset-signal input terminal R1, the second control terminal ctrl8 of the reset module 160 is electrically connected to the second reset-signal input terminal R2, the input terminal in8 of the reset module 160 is electrically connected to the second power-signal input terminal VGL, the first output terminal out5 of the reset module 160 is electrically connected to the first node P, and the second output terminal out6 of the reset module 160 is electrically connected to the scanning-signal output terminal GOUT. The reset module 160 is configured to reset the first node P and the scanning-signal output terminal GOUT.

In one embodiment, the operating process of the shift register may be divided into three phases.

In the first phase, a first reset signal inputted to the first reset-signal input terminal R1 is at a first level, and the reset module 160 controls, according to the first level, a second level signal of the second power-signal input terminal VGL to be output to the first node P through the first output terminal out5, to reset the first node P. A second reset signal inputted to the second reset-signal input terminal R2 is at the first level, and the reset module 160 controls, according to the first level, the second level signal of the second power-signal input terminal VGL to be output to the scanning-signal output terminal GOUT through the second output terminal out6, to reset the scanning-signal output terminal GOUT. Exemplarily, the first level is a logic high level and a second level is a logic low level.

In the second phase, the first reset signal inputted to the first reset-signal input terminal R1 and the second reset signal R2 inputted to the second reset-signal input terminal R2 are each at the second level, a first level signal is inputted to the first control-signal input terminal G1, the first input terminal in1 and the output terminal out1 of the first node control module 110 are controlled to be connected to each other, and a first potential signal inputted to the first potential-signal input terminal V1 is output to the first node P. Exemplarily, the first potential signal may be at a logic high level. The first node P controls, through the first control terminal ctrl4 of the output module 130, a clock signal inputted to the clock-signal input terminal CLOCK to be output through the scanning-signal output terminal GOUT of the output module 130 so that the shift register can output a scanning signal.

In the third phase, the first reset signal inputted to the first reset-signal input terminal R1 and the second reset signal inputted to the second reset-signal input terminal R2 are each at the second level, the first level signal is inputted to the second control-signal input terminal G2, the second input terminal in2 and the output terminal out1 of the first node control module 110 are controlled to be connected to each other, and a second potential signal inputted to the second potential-signal input terminal V2 is output to the second node Q. Exemplarily, the second potential signal may be at a logic low level. The first node P controls, through the second control terminal ctrl5 of the output module 130, the second level signal inputted to the second power-signal input terminal VGL to be output through the scanning-signal output terminal GOUT of the output module 130 so that the shift register keeps a logic low-level signal after outputting the scanning signal and a display panel connected to multi-stage shift registers implements progressive scanning.

During the preceding operating process, in the third phase, the potential of the first node P is at the second level equal to the potential of the second level signal of the second power-signal input terminal VGL, potentials of the first control terminal ctrl7 and the second control terminal ctrl8 of the reset module 160 are each at the second level equal to the potential of the input terminal in8 of the reset module 160. Therefore, in the third phase, the first control terminal ctrl7, the second control terminal ctrl8, the input terminal in8, the first output terminal out5 and the second output terminal out6 of the reset module 160 have the same potential so that the reset module 160 can be prevented from generating a leakage current, reducing the power consumption of the shift register.

Figure 3:
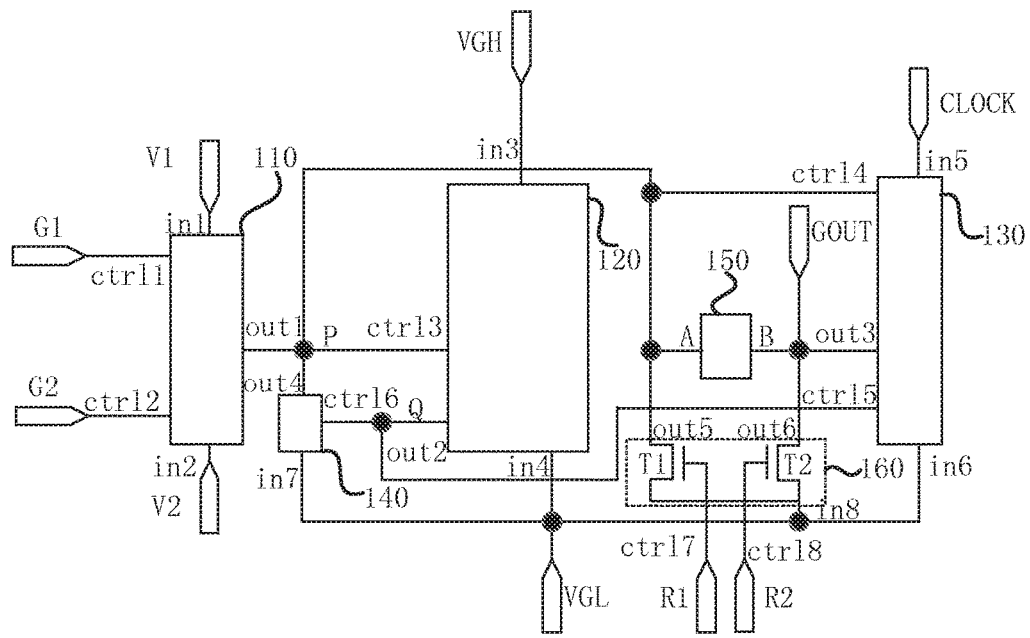
FIG. 3 is a schematic diagram of another shift register according to an embodiment of the present disclosure.

Exemplarily, FIG. 3 is a schematic diagram of another shift register according to an embodiment of the present disclosure. As shown in FIG. 3, the reset module 160 includes a first transistor T1 and a second transistor T2. The gate of the first transistor T1 is configured as the first control terminal ctrl7 of the reset module 160, the gate of the second transistor T2 is configured as the second control terminal ctrl8 of the reset module 160, a first electrode of the first transistor T1 and a first electrode of the second transistor T2 are configured as the input terminal in8 of the reset module 160, a second electrode of the first transistor T1 is configured as the first output terminal out5 of the reset module 160, and a second electrode of the second transistor T2 is configured as the second output terminal out6 of the reset module 160.

In one embodiment, FIG. 3 exemplarily shows that each of the first transistor T1 and the second transistor T2 is an N-type transistor. In the first phase, a signal at the first level is inputted to the first reset-signal input terminal R1 and the second reset signal input terminal R2 to control the first transistor T1 and the second transistor T2 to turn on. The first transistor T1 outputs a signal at the second level inputted to the second power-signal input terminal VGL to the first node P, to reset the first node P. The first node P transmits the second level to the first control terminal ctrl4 of the output module 130, to reset the first control terminal ctrl4 of the output module 130. Meanwhile, the second transistor T2 outputs the signal at the second level inputted to the second power-signal input terminal VGL to the scanning-signal output terminal GOUT, to reset the scanning-signal output terminal GOUT. In the third phase, the signal at the second level is inputted to the first reset-signal input terminal R1 and the second reset signal input terminal R2 to control the first transistor T1 and the second transistor T2 to be turned off, respectively. Potentials of gates of the first transistor T1 and the second transistor T2 are at the second levels inputted to the first reset-signal input terminal R1 and the second reset-signal input terminal R2, respectively, each of the potentials of first electrodes of the first transistor T1 and the second transistor T2 is at the second level inputted to the second power-signal input terminal VGL, and the gate and the first electrode of the first transistor T1 have the same potential as the gate and the first electrode of the first transistor T2. Moreover, the potential of the first node P is at the second level inputted to the second potential-signal input terminal V2, that is, the gate, the first electrode and the second electrode of the first transistor T1 have the same potential as the gate, the first electrode and the second electrode of the second transistor T2 so that the first transistor T1 and the second transistor T2 can be prevented from generating leakage currents in the third phase.

Figure 4:
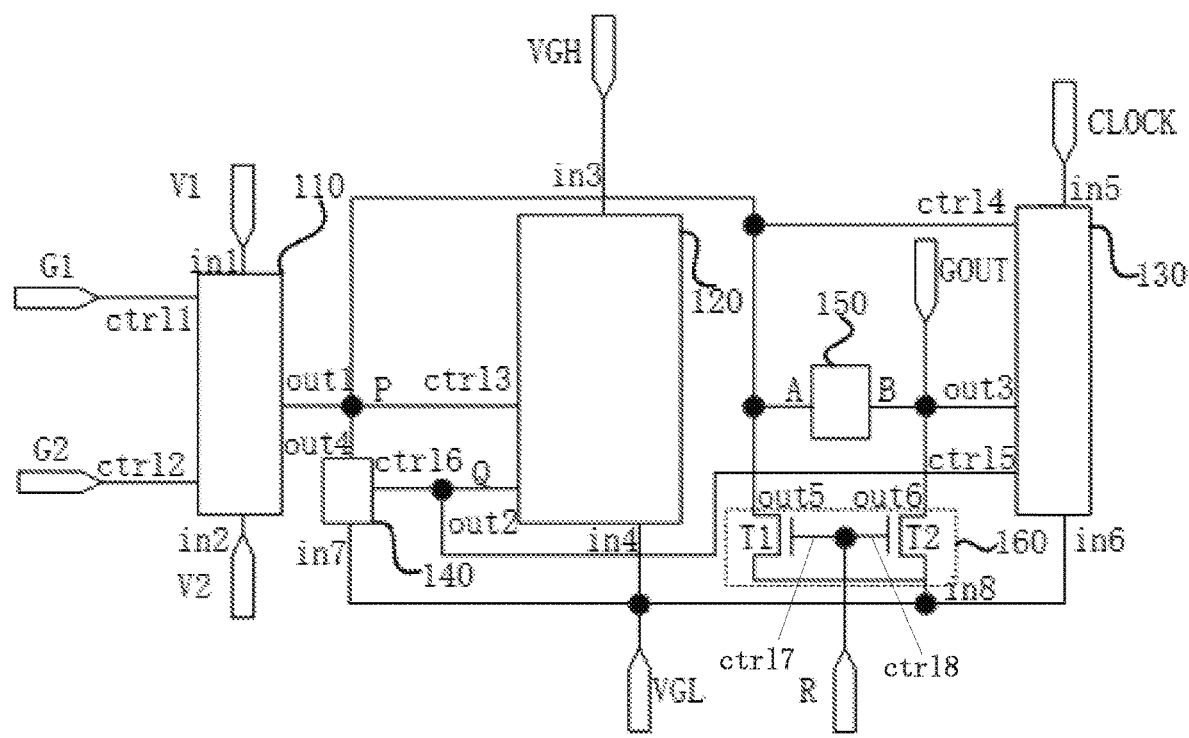
FIG. 4 is a schematic diagram of another shift register according to an embodiment of the present disclosure.

FIG. 4 is a schematic diagram of another shift register according to an embodiment of the present disclosure. As shown in FIG. 4, the first transistor T1 has the same channel type as the second transistor T2, the gate of the first transistor T1 is electrically connected to the gate of the second transistor T2, and the first reset-signal input terminal and the second reset-signal input terminal are the same reset-signal input terminal R.

In one embodiment, when the first transistor T1 has the same channel type as the second transistor T2, the gate of the first transistor T1 is configured to be electrically connected to the gate of the second transistor T2 so that the same signal can control the gate of the first transistor T1 and the gate of the second transistor T2 to be turned on or turned off simultaneously. Therefore, the first reset-signal input terminal and the second reset-signal input terminal are configured to be the same reset-signal input terminal R. A reset signal input from the reset-signal input terminal R can control the first transistor T1 and the second transistor T2 to be turned on or turned off simultaneously, to reset the first node P and the scanning-signal output terminal GOUT. This also can reduce the setting of one reset-signal input terminal and one reset signal wire, reducing the wire setting and the occupied area of the shift register and reducing the cost.

Figure 5:
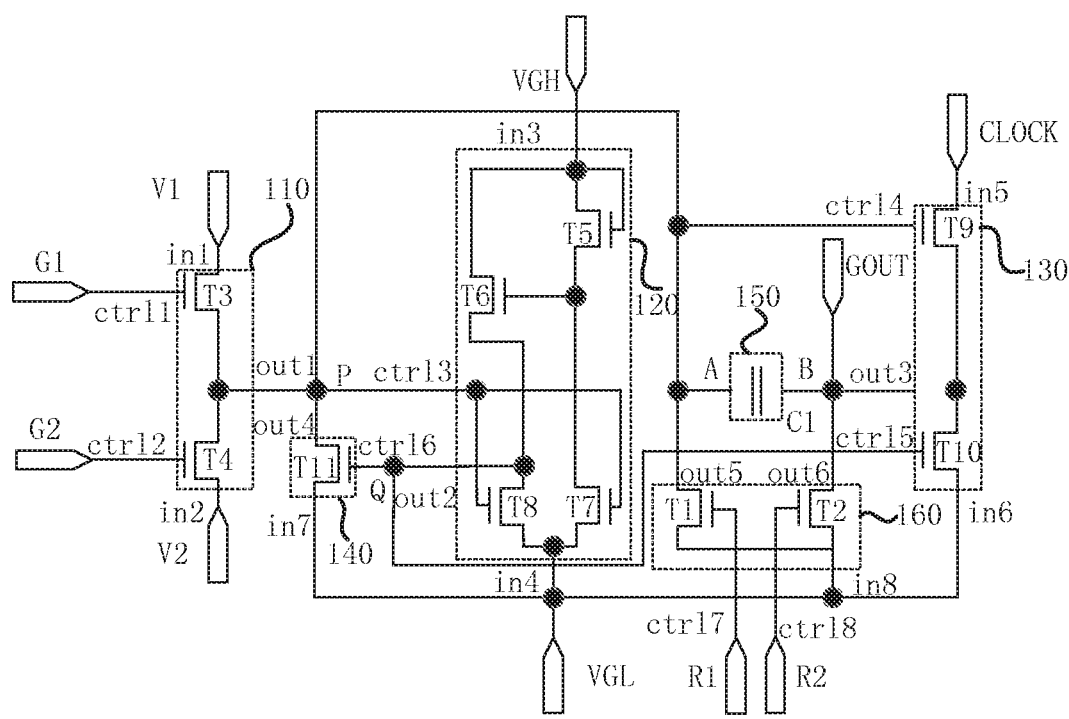
FIG. 5 is a schematic diagram of another shift register according to an embodiment of the present disclosure.

FIG. 5 is a schematic diagram of another shift register according to an embodiment of the present disclosure. As shown in FIG. 5, the first node control module 110 of the shift register includes a third transistor T3 and a fourth transistor T4. The gate of the third transistor T3 is configured as the first control terminal ctrl1 of the first node control module 110, the gate of the fourth transistor T4 is configured as the second control terminal ctrl2 of the first node control module 110, a first electrode of the third transistor T3 and a second electrode of the fourth transistor T4 are electrically connected to each other and configured as the output terminal out1 of the first node control module 110, a second electrode of the third transistor T3 is configured as the first input terminal in1 of the first node control module 110, and a first electrode of the fourth transistor T4 is configured as the second input terminal in2 of the first node control module 110.

In one embodiment, FIG. 5 exemplarily shows that the third transistor T3 and the fourth transistor T4 are each an N-type transistor. When the first control-signal input terminal G1 is at a logic high level, the third transistor T3 is turned on, and the first node control module 110 outputs the first level signal inputted to the first potential-signal input terminal V1. When the second control-signal input terminal G2 is at a logic high level, the fourth transistor T4 is turned on, and the first node control module 110 outputs the second level signal inputted to the second potential-signal input terminal V2. Thereby, the potential of the first node P can be controlled.

Continuing to refer to FIG. 5, the voltage division module includes a fifth transistor T5, a sixth transistor T6, a seventh transistor T7 and an eighth transistor T8. The gate and a first electrode of the fifth transistor T5 and a first electrode of the sixth transistor T6 are configured as the first input terminal in3 of the voltage division module 120, a second electrode of the fifth transistor T5 and a first electrode of the seventh transistor T7 are electrically connected to the gate of the sixth transistor T6, a second electrode of the sixth transistor T6 and a first electrode of the eighth transistor T8 are electrically connected to each other and configured as the output terminal out2 of the voltage division module 120, the gate of the seventh transistor T7 and the gate of the eighth transistor T8 are electrically connected to each other and configured as the control terminal ctrl3 of the voltage division module 120, and a second electrode of the seventh transistor T7 and a second electrode of the eighth transistor T8 are configured as the second input terminal in4 of the voltage division module 120. The output module 130 includes a ninth transistor T9 and a tenth transistor T10. The gate of the ninth transistor T9 is configured as the first control terminal ctrl4 of the output module 130, a first electrode of the ninth transistor T9 is configured as the first input terminal in5 of the output module 130, a second electrode of the ninth transistor T9 and a first electrode of the tenth transistor T10 are electrically connected to each other and configured as the output terminal out3 of the output module 130, the gate of the tenth transistor T10 is configured as the second control terminal ctrl5 of the output module 130, and a second electrode of the tenth transistor T10 is configured as the second input terminal in6 of the output module 130. The second node control module 140 includes an eleventh transistor T11. The gate of the eleventh transistor T11 is configured as the control terminal ctrl6 of the second node control module 140, a first electrode of the eleventh transistor T11 is configured as the input terminal in7 of the second node control module 140, and a second electrode of the eleventh transistor T11 is configured as the output terminal out4 of the second node control module 140.

Figure 6:
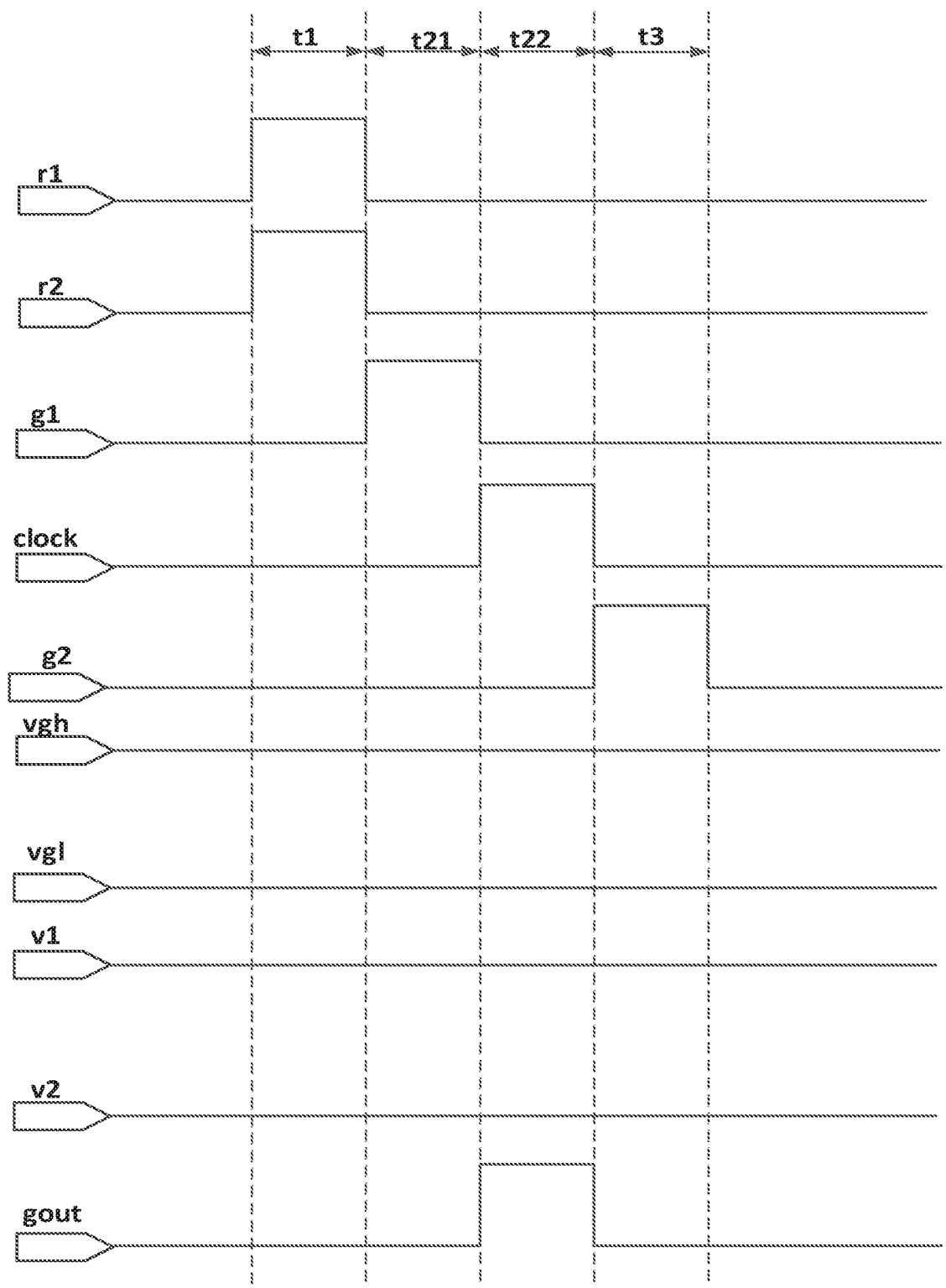
FIG. 6 is a timing diagram corresponding to the schematic diagram of the shift register of FIG. 5.

In one embodiment, the storage module 150 may be a storage capacitor C1. A first terminal of the storage capacitor C1 is configured as the first terminal A of the storage module 150, and a second terminal of the storage capacitor C1 is configured as the second terminal B of the storage module 150. FIG. 5 exemplarily shows that the fifth transistor T5, the sixth transistor T6, the seventh transistor T7, the eighth transistor T8, the ninth transistor T9, the tenth transistor T10 and the eleventh transistor T11 are each an N-type transistor. FIG. 6 is a timing diagram corresponding to the schematic diagram of the shift register of FIG. 5. As shown in FIG. 6, g1 is a timing signal of the first control-signal input terminal G1, g2 is a timing signal of the second control-signal input terminal G2, v1 is a timing signal of the first potential-signal input terminal V1, and v2 is a timing signal of the second potential-signal input terminal V2, vgh is a timing signal of the first power-signal input terminal VGH, vgl is a timing signal of the second power-signal input terminal VGL, clock is a timing signal of the clock-signal input terminal CLOCK, and r1 is a timing signal of the first reset-signal input terminal R1, r2 is a timing signal at the second reset-signal input terminal R2, and gout is a timing signal of the scanning-signal output terminal GOUT. The operating process of the shift register is described below.

In the first phase t1, each of r1 and r2 is at a logic high level, the first transistor T1 and the second transistor T2 are turned on, and the first node P and the scanning-signal output terminal GOUT are reset.

It is to be noted that when the shift register operates, a logic high level is inputted to the first power-signal input terminal VGH, so the fifth transistor T5 and the sixth transistor T6 are each in an on state. At the same time, the potential of the second node Q rises to a state in which the tenth transistor T10 and the eleventh transistor T11 can be turned on, so that the tenth transistor T10 and the eleventh transistor T11 are turned on, lowering potentials of the first node P and the scanning signal input terminal GOUT.

The second phase includes a first sub-phase t21 and a second sub-phase t22. In the first sub-phase t21, the first node P inputs the first level inputted to the first potential-signal input terminal V1, and the third transistor T3 is turned on and inputs the first level to the first node P. Since the first level is a logic high level, the third transistor T3 has a higher charge capacity to the first node P than the discharge capacity of the eleventh transistor T11, so the potential of the first node P gradually rises and controls the seventh transistor T7 and the eighth transistor T8 to turn on. At this time, the potential of the second node Q is the divided voltage of the voltage difference between the first level signal of the first power-signal input terminal VGH and the second level signal of the second power-signal input terminal VGH by the sixth transistor T6 and the eighth transistor T8. Therefore, it is feasible to avoid setting a capacitor between the second node Q and the first power-signal input terminal VGH and generating AC coupling power consumption caused by bootstrap, reducing the power consumption of the shift register.

Additionally, when the seventh transistor T7 and the eighth transistor T8 are turned on, the potential of the second node Q is relatively low, the tenth transistor T10 and the eleventh transistor T11 are turned off, and the potential of the first node P is at the first level. When the third transistor T3 is turned off, the storage capacitor C1 stabilizes the potential of the first node P, and the ninth transistor T9 is turned on.

In the second sub-phase t22, after the clock signal clock is inputted to the clock signal input terminal CLOCK, the ninth transistor T9 outputs the clock-signal clock to the scanning-signal output terminal GOUT, that is, the scanning signal is output through the scanning-signal output terminal GOUT.

At the third phase t3, the second control signal g2 inputted to the second control-signal input terminal G2 is at a logic high level, the fourth transistor T4 is turned on, and the second potential signal v2 inputted to the second potential-signal input terminal V2 is output through the output terminal out1 of the first node control module 110. The second potential signal v2 is at a logic low level so that the potential of the first node P is at a logic low-level, and the seventh transistor T7, the eighth transistor T8 and the ninth transistor T9 are turned off. Thus, the potential of the second node Q rises to turn on the tenth transistor T10 and the eleventh transistor T11, so the second level inputted to the second power-signal input terminal VGL is output to the scanning-signal output terminal GOUT through the tenth transistor T10 so that the scanning signal stops being output through the scanning-signal output terminal GOUT.

When the second control signal g2 inputted to the second control-signal input terminal G2 is changed from the logic high level to a logic low-level, the first node P always has a low potential since the unchanged potential of the second node Q, so that a logic low level is always guaranteed to be output through the scanning-signal output terminal GOUT before the first control signal g1 inputted to the first control-signal input terminal G1 is at a logic high level.

Figure 7:
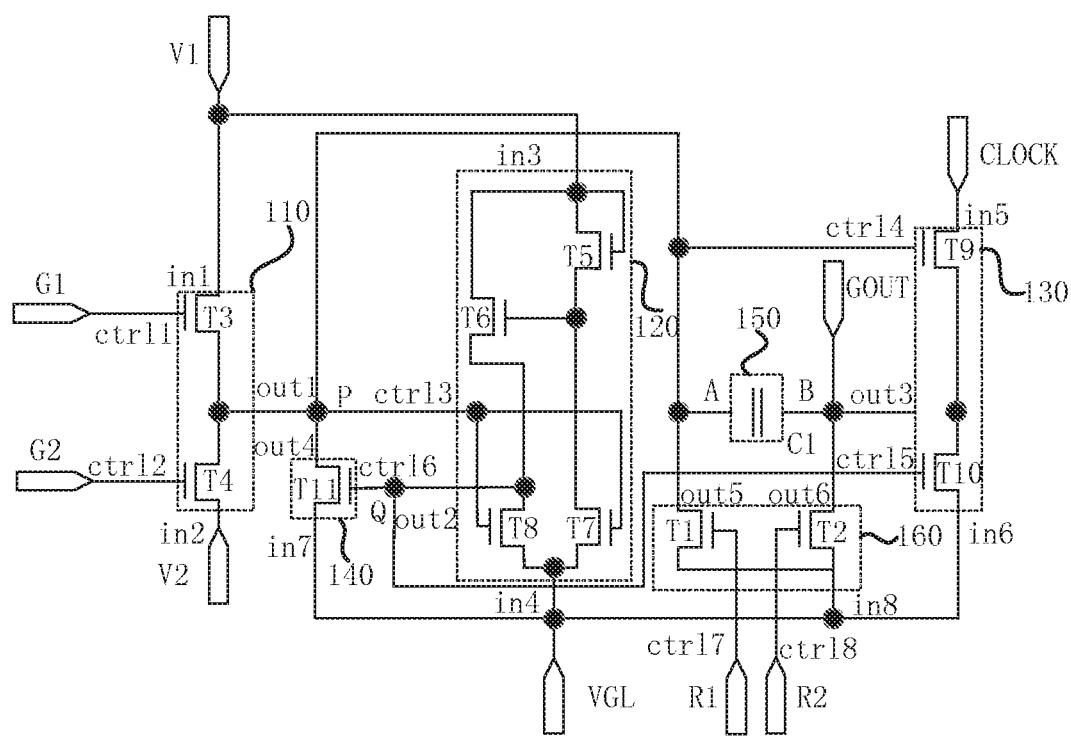
FIG. 7 is a schematic diagram of another shift register according to an embodiment of the present disclosure.

FIG. 7 is a schematic diagram of another shift register according to an embodiment of the present disclosure. As shown in FIG. 7, the fifth transistor T5, the sixth transistor T6, the seventh transistor T7 and the eighth transistor T8 have the same channel type, and the first potential-signal input terminal V1 is reused as the first power-signal input terminal.

In one embodiment, when the fifth transistor T5, the sixth transistor T6, the seventh transistor T7 and the eighth transistor T8 have the same channel type, the same level signal may control the fifth transistor T5, the sixth transistor T6, the seventh transistor T7 and the eighth transistor T8 to turn on or turned off simultaneously. FIG. 7 exemplarily shows that the fifth transistor T5, the sixth transistor T6, the seventh transistor T7 and the eighth transistor T8 are each an N-type transistor. In this case, the first potential-signal input terminal V1 may be configured to be reused as the first power-signal input terminal, and the fifth transistor T5 and the sixth transistor T6 can also be turned on. Moreover, in the first phase, the first potential signal inputted to the first potential-signal input terminal V1 controls the seventh transistor T7 and the eighth transistor T8 to turn on. This can not only enable the normal operation of the shift register, but also reduce the setting of a first power-signal wire, reducing the wire setting and the occupied area of the shift register and reducing the cost.

Figure 8:
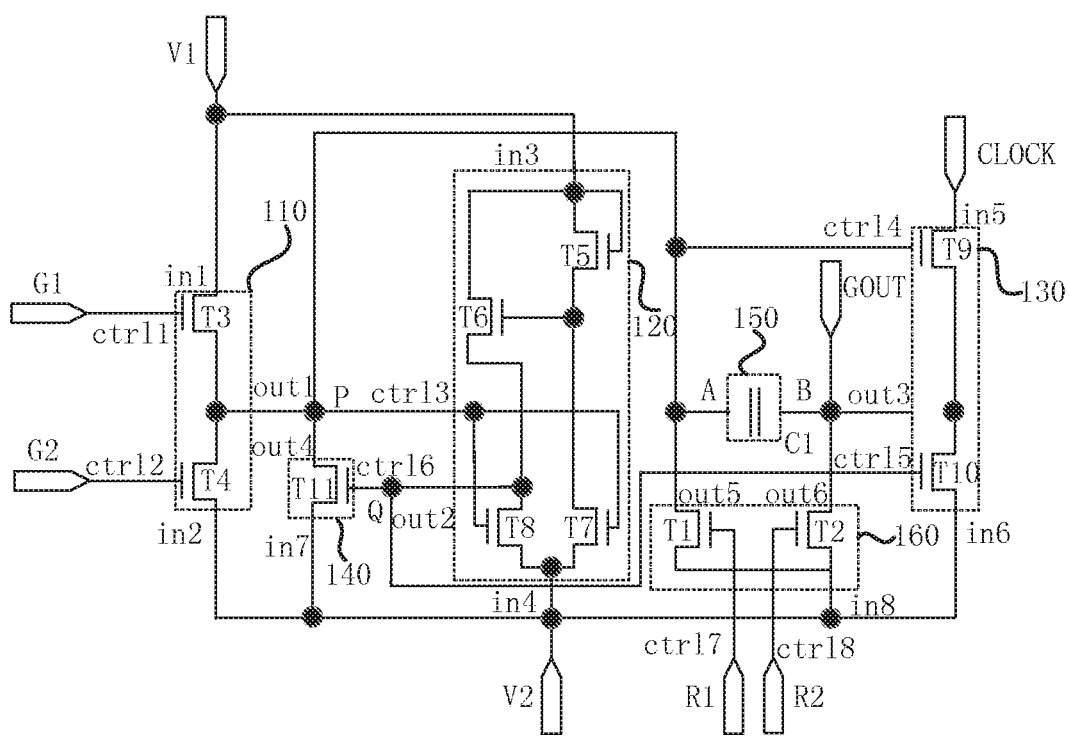
FIG. 8 is a schematic diagram of another shift register according to an embodiment of the present disclosure.

FIG. 8 is a schematic diagram of another shift register according to an embodiment of the present disclosure. As shown in FIG. 8, the second potential-signal input terminal V2 is reused as the second power-signal input terminal. In the third phase, the second potential signal inputted to the second potential-signal input terminal V2 is at a logic low level, and a power signal is provided to the shift register through the second power-signal input terminal. This can not only enable the normal operation of the shift register, but also reduce the setting of a second power-signal wire, further reducing the wire setting and the occupied area of the shift register and reducing the cost.

Figure 9:
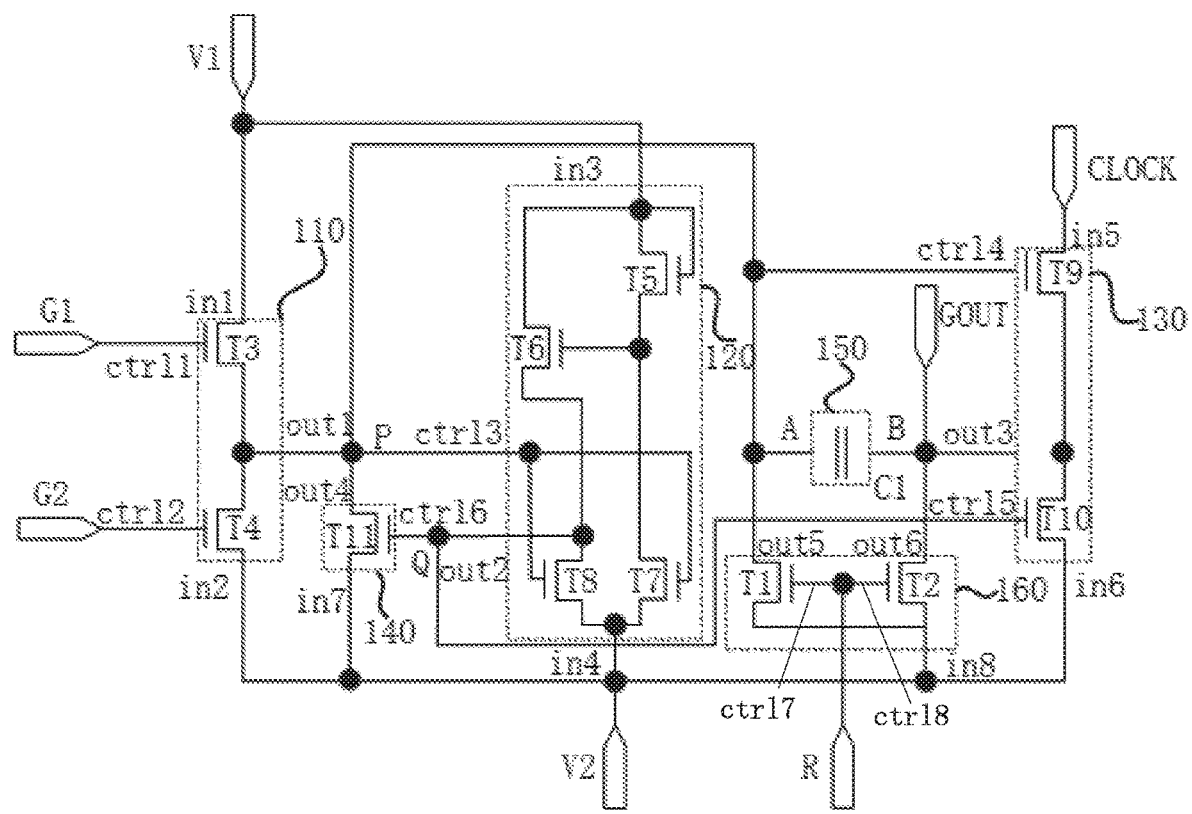
FIG. 9 is a schematic diagram of another shift register according to an embodiment of the present disclosure.

FIG. 9 is a schematic diagram of another shift register according to an embodiment of the present disclosure. As shown in FIG. 9, the reset module 160 includes a first transistor T1 and a second transistor T2. The gate of the first transistor T1 is configured as the first control terminal ctrl7 of the reset module 160, the gate of the second transistor T2 is configured as the second control terminal ctrl8 of the reset module 160, a first electrode of the first transistor T1 and a first electrode of the second transistor T2 are configured as the input terminal in8 of the reset module 160, a second electrode of the first transistor T1 is configured as the first output terminal out5 of the reset module 160, and a second electrode of the second transistor T2 is configured as the second output terminal out6 of the reset module 160. The voltage division module includes a fifth transistor T5, a sixth transistor T6, a seventh transistor T7 and an eighth transistor T8. The gate and a first electrode of the fifth transistor T5 and a first electrode of the sixth transistor T6 are configured as the first input terminal in3 of the voltage division module 120, a second electrode of the fifth transistor T5 and a first electrode of the seventh transistor T7 are electrically connected to the gate of the sixth transistor T6, a second electrode of the sixth transistor T6 and a first electrode of the eighth transistor T8 are electrically connected to each other and configured as the output terminal out2 of the voltage division module 120, the gate of the seventh transistor T7 and the gate of the eighth transistor T8 are electrically connected to each other and configured as the control terminal ctrl3 of the voltage division module 120, and a second electrode of the seventh transistor T7 and a second electrode of the eighth transistor T8 are configured as the second input terminal in4 of the voltage division module 120.

The first transistor T1 has the same channel type as the second transistor T2, the gate of the first transistor T1 is electrically connected to the gate of the second transistor T2, and the first reset-signal input terminal and the second reset-signal input terminal are the same reset-signal input terminal R. The fifth transistor T5, the sixth transistor T6, the seventh transistor T7 and the eighth transistor T8 have the same channel type, and the first potential-signal input terminal V1 is reused as the first power-signal input terminal VGH.

In one embodiment, the first reset-signal input terminal and the second reset-signal input terminal are the same reset-signal input terminal R, and meanwhile, the first potential-signal input terminal V1 is reused as the first power-signal input terminal VGH. This can not only enable the normal operation of the shift register, but also reduce the setting of a second power-signal wire, further reducing the wire setting and the occupied area of the shift register and reducing the cost.

Continuing to refer to FIG. 9, the first transistor T1 has the same channel type as the fifth transistor T5. When the first transistor T1 has the same channel type as the fifth transistor T5, the first transistor T1, the second transistor T2, the fifth transistor T5, the sixth transistor T6, the seventh transistor T7 and the eighth transistor T8 all have the same channel type. For example, the first transistor T1, the second transistor T2, the fifth transistor T5, the sixth transistor T6, the seventh transistor T7 and the eighth transistor T8 are each an N-type transistor. In this case, a signal inputted to the first potential-signal input terminal V1 may be at a logic high level, and in the reset phase, a signal inputted to the first reset-signal input terminal R may be at a logic high level.

Figure 10:
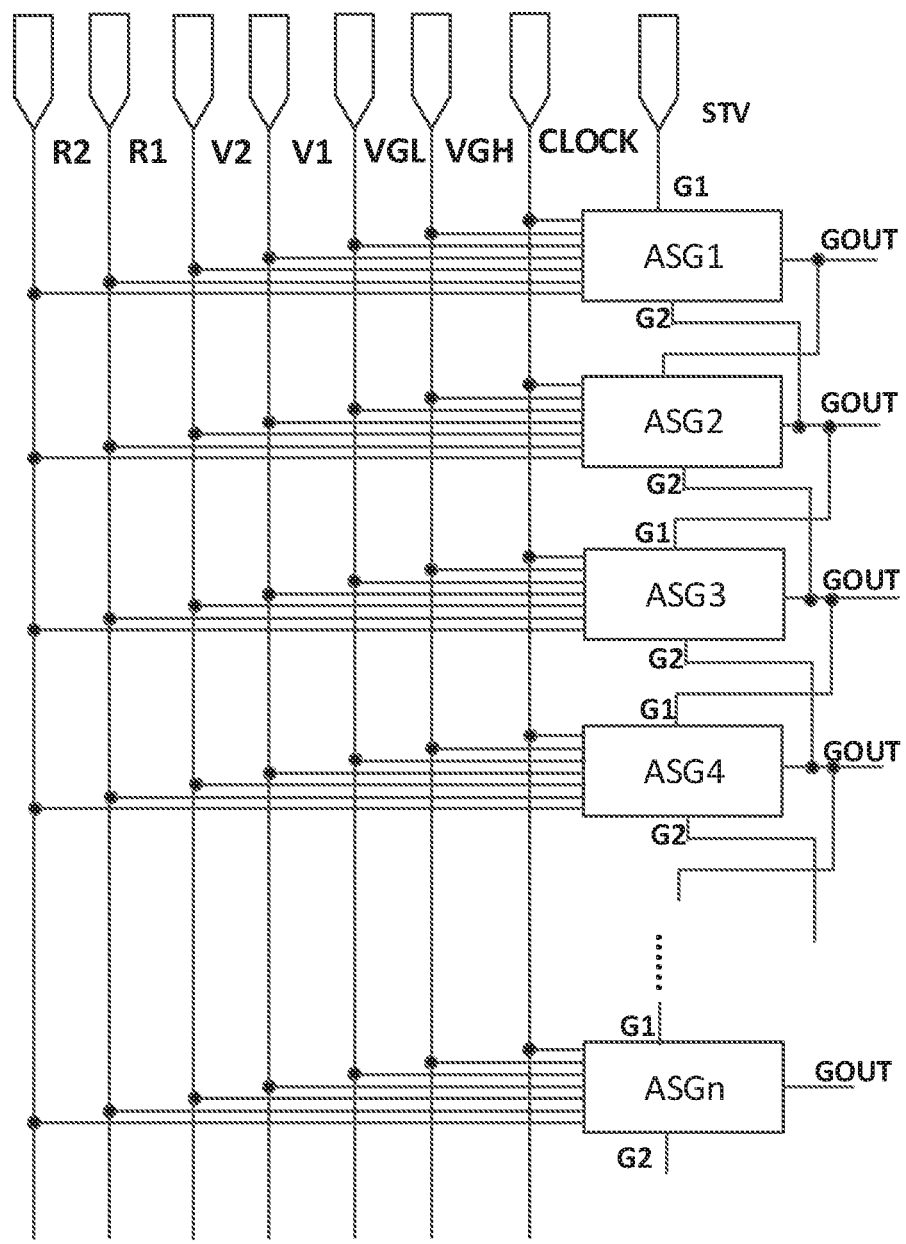
FIG. 10 is a structural diagram of a gate drive circuit according to an embodiment of the present disclosure.

An embodiment of the present disclosure further provides a gate drive circuit. FIG. 10 is a structural diagram of a gate drive circuit according to an embodiment of the present disclosure. As shown in FIG. 10, the gate drive circuit includes multiple cascaded shift registers provided by any embodiment of the present disclosure. The first control-signal input terminal G1 of the first-stage shift register ASG1 is electrically connected to an initial-signal input terminal STV of the gate drive circuit, the scanning-signal output terminal GOUT of the previous-stage shift register is electrically connected to the first control-signal input terminal G1 of the next-stage shift register, and the scanning-signal output terminal GOUT of the next-stage shift register is electrically connected to the second control-signal input terminal G2 of the previous-stage shift register.

In one embodiment, FIG. 10 exemplarily shows that the gate drive circuit includes n cascaded shift registers ASG1, ASG2, . . . , and ASGn, and the n cascaded shift registers are reset through reset signals inputted to a reset-signal input terminal R1 and a second reset-signal input terminal R2. Then, the first-stage shift register ASG1 enters the second phase according to the initial-signal input terminal STV. When a scanning signal are output through the scanning-signal output terminal of the previous-stage shift register, a first control signal is inputted to the first control-signal input terminal G1 of the next-stage shift register and controls the next-stage shift register to start the second phase. When a scanning signal is output through the scanning-signal output terminal GOUT of the next-stage shift register, the previous-stage shift register is controlled to start the third phase, so that the scanning-signal output terminal GOUT of the previous-stage shift register keeps at a logic low level. In this way, the cascaded shift registers sequentially output scanning signals.

Figure 11:
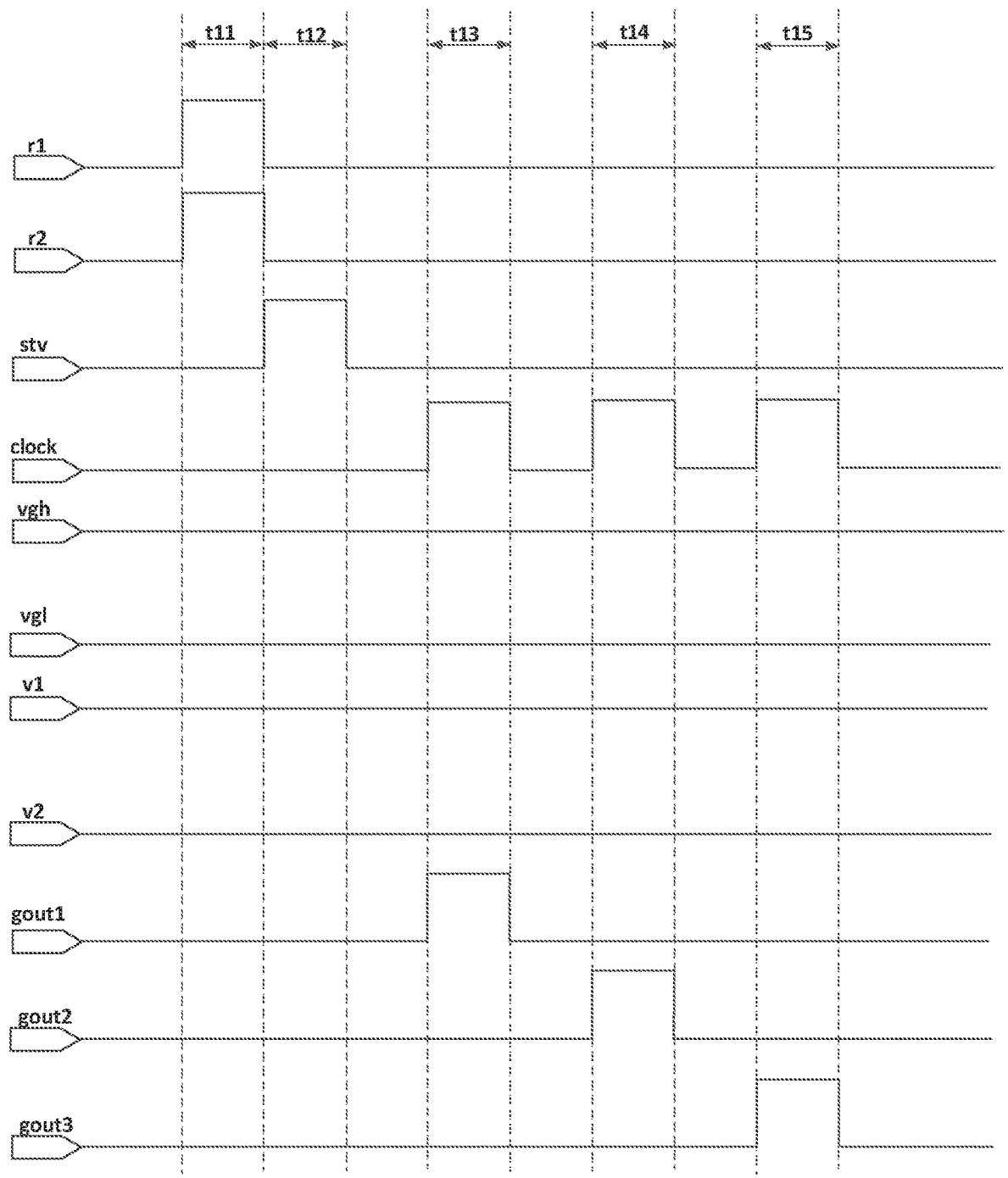
FIG. 11 is a timing diagram corresponding to the gate drive circuit of FIG. 10.

Exemplarily, the first-stage shift register ASG1, the second-stage shift register ASG2 and the third-stage shift register ASG3 are used as an example for description. FIG. 11 is a timing diagram corresponding to the gate drive circuit of FIG. 10, where sty is a timing signal of the initial-signal input terminal STV.

In the first phase t11, a first reset signal r1 and a second reset signal r2 are inputted to the first reset-signal input terminal R1 and the second reset-signal input terminal R2, respectively, to reset all the cascaded shift registers. In the second phase t12, a start signal sty is input to the first control-signal input terminal G1 of the first-stage shift register ASG1 through the initial-signal input terminal STV, and the first-stage shift register ASG1 enters the operating phase. In the third phase t13, a scanning signal gout1 is output through a scanning-signal output terminal GOUT of the first-stage shift register ASG1. The scanning signal gout1 is output to pixel circuits in the first row through the scanning-signal output terminal GOUT of the first-stage shift register ASG1 to drive the pixel circuits in the first row to operate. At the same time, the scanning signal of the first-stage shift register ASG1 is transmitted to the first control-signal input terminal G1 of the second-stage shift register ASG2 so that the second-stage shift register ASG2 enters the operating phase. In the fourth phase t14, a scanning signal gout2 is output through the scanning-signal output terminal GOUT of the second-stage shift register ASG2. The scanning signal gout2 is output to pixel circuits in the second row through the scanning-signal output terminal GOUT of the second-stage shift register ASG2 to drive the pixel circuits in the second row to operate. At the same time, the scanning signal gout2 of the second-stage shift register ASG2 is transmitted to the second control-signal input terminal G2 of the first-stage shift register ASG1 so that the first-stage shift register ASG1 outputs a logic low level. That is, the first-stage shift register ASG1 stops outputting the scanning signal gout1 and ensures that the gate drive circuit outputs scanning signals row-by-row. Similarly, the scanning signal output through the scanning-signal output terminal GOUT of the second-stage shift register ASG2 is transmitted to the first control-signal input terminal G1 of the third-stage shift register ASG3 so that the third-stage shift register ASG3 enters the operating phase. In the fifth phase t15, a scanning signal gout3 is output through the scanning-signal output terminal GOUT of the third-stage shift register ASG3, and then the preceding process repeats.

Embodiments includes the shift register of any embodiment of present disclosure, and thus has the beneficial effects of the shift register of any embodiment, which will not be repeated here.

Figure 12:
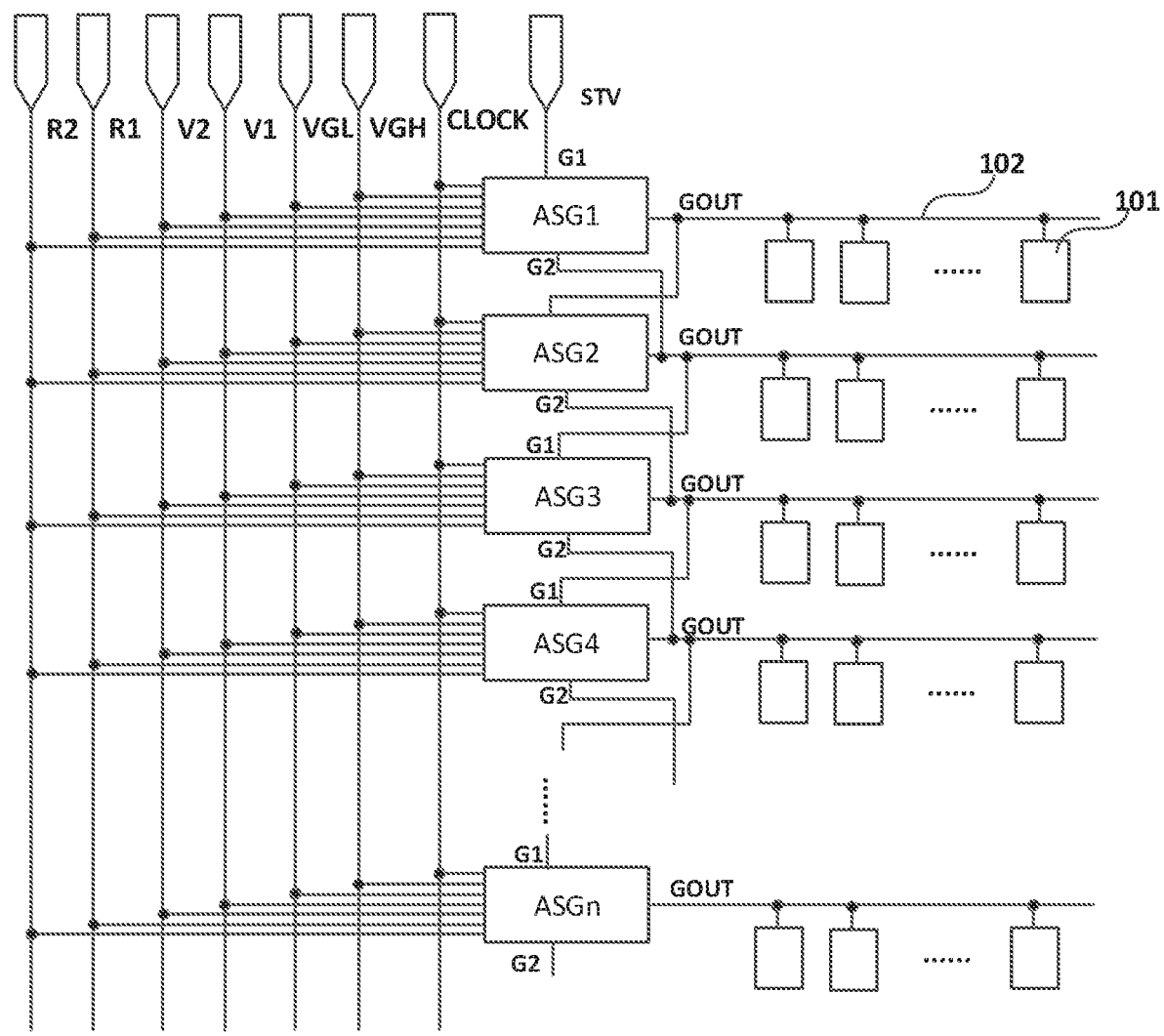
FIG. 12 is a structural diagram of a display panel according to an embodiment of the present disclosure.

An embodiment of the present disclosure further provides a display panel. FIG. 12 is a structural diagram of a display panel according to an embodiment of the present disclosure. As shown in FIG. 12, the display panel includes the gate drive circuit of any embodiment of the present disclosure.

In one embodiment, the display panel further includes pixels 101 and scanning signal wires 102 arranged in an array, and the gate drive circuit is electrically connected to the pixels 101 through the scanning signal wires 102. As shown in FIG. 10, the shift registers are in one-to-one correspondence to the scanning-signal wires 102 and provide scanning signals to each row of pixels 101 through the scanning signal wires 102. When the cascaded shift registers sequentially output the scanning signals, the pixels 101 in the display panel are provided with the scanning signals row by row.

Embodiments includes the shift register of any embodiment, and thus has the beneficial effects of the shift register of any embodiment, which will not be repeated here.

What is claimed is:

1. A shift register, comprising: a first control-signal input terminal, a second control-signal input terminal, a first potential-signal input terminal, a second potential-signal input terminal, a first node, a second node, a first power-signal input terminal, a second power-signal input terminal, a clock-signal input terminal, a first reset-signal input terminal, a second reset-signal input terminal, a scanning-signal output terminal, a first node control module, a voltage division module, an output module, a second node control module, a storage module and a reset module;

wherein the first node control module comprises a first control terminal, a second control terminal, a first input terminal, a second input terminal and an output terminal, wherein the first control terminal of the first node control module is electrically connected to the first control-signal input terminal, the second control terminal of the first node control module is electrically connected to the second control-signal input terminal, the first input terminal of the first node control module is electrically connected to the first potential-signal input terminal, the second input terminal of the first node control module is electrically connected to the second potential-signal input terminal, the output terminal of the first node control module is electrically connected to the first node, and wherein the first node control module is configured to control the first input terminal of the first node control module to communicate with the output terminal of the first node control module according to a signal inputted to the first control terminal of the first node control module, or to control the second input terminal of the first node control module to communicate with the output terminal of the first node control module according to a signal inputted to the second control terminal of the first node control module;

wherein the voltage division module comprises a first input terminal, a second input terminal, a control terminal and an output terminal, wherein the first input terminal is electrically connected to the first power-signal input terminal, the second input terminal is electrically connected to the second power-signal input terminal, the control terminal of the voltage division module is electrically connected to the first node, the output terminal is electrically connected to the second node, and wherein the voltage division module is configured to control a voltage of the second node to be a divided voltage of a voltage difference between a first power signal inputted to the first power-signal input terminal and a second power signal inputted to the second power-signal input terminal;

wherein the output module comprises a first control terminal, a second control terminal, a first input terminal, a second input terminal and an output terminal, wherein the first control terminal of the output module is electrically connected to the first node, the second control terminal of the output module is electrically connected to the second node, the first input terminal of the output module is electrically connected to the clock-signal input terminal, the second input terminal of the output module is electrically connected to the second power-signal input terminal, the output terminal of the output module is electrically connected to the scanning-signal output terminal, and wherein the output module is configured to output a signal of the clock-signal input terminal according to a potential of the first node, or to output a signal of the second power-signal input terminal according to a potential of the second node;

wherein the second node control module comprises a control terminal, an input terminal and an output terminal, wherein the output terminal of the second node control module is electrically connected to the first node, the input terminal of the second node control module is electrically connected to the second power-signal input terminal, the control terminal of the second node control module is electrically connected to the second node, and wherein the second node control module is configured to control the potential of the first node according to the potential of the second node;

wherein the storage module comprises a first terminal and a second terminal, wherein the first terminal of the storage module is electrically connected to the first node, the second terminal of the storage module is electrically connected to the scanning-signal output terminal, and wherein the storage module is configured to maintain potentials of the first node and the scanning-signal output terminal to be in a stable state; and wherein the reset module comprises a first control terminal, a second control terminal, an input terminal, a first output terminal and a second output terminal, wherein the first control terminal of the reset module is electrically connected to the first reset-signal input terminal, the second control terminal of the reset module is electrically connected to the second reset-signal input terminal, the input terminal of the reset module is electrically connected to the second power-signal input terminal, the first output terminal of the reset module is electrically connected to the first node, the second output terminal of the reset module is electrically connected to the scanning-signal output terminal, and the reset module is configured to reset the first node and the scanning-signal output terminal.

2. The shift register of claim 1, wherein the reset module comprises a first transistor and a second transistor, wherein
a gate of the first transistor is configured as the first control terminal of the reset module, a gate of the second transistor is configured as the second control terminal of the reset module, a first electrode of the first transistor and a first electrode of the second transistor are configured as the input terminal of the reset module, a second electrode of the first transistor is configured as the first output terminal of the reset module, and a second electrode of the second transistor is configured as the second output terminal of the reset module.

3. The shift register of claim 2, wherein the first transistor has a same channel type as the second transistor, the gate of the first transistor is electrically connected to the gate of the second transistor, and the first reset-signal input terminal and the second reset-signal input terminal are a same reset-signal input terminal.

4. The shift register of claim 2, wherein the division voltage module comprises a fifth transistor, a sixth transistor, a seventh transistor and an eighth transistor, wherein
a gate and a first electrode of the fifth transistor and a first electrode of the sixth transistor are configured as the first input terminal of the voltage division module, a second electrode of the fifth transistor and a first electrode of the seventh transistor are electrically connected to a gate of the sixth transistor, a second electrode of the sixth transistor and a first electrode of the eighth transistor are electrically connected to each other and configured as the output terminal of the voltage division module, a gate of the seventh transistor and a gate of the eighth transistor are electrically connected to each other and configured as the control terminal of the voltage division module, and a second electrode of the seventh transistor and a second electrode of the eighth transistor are configured as the second input terminal of the voltage division module.

5. The shift register of claim 4, wherein the first transistor has a same channel type as the second transistor, the gate of the first transistor is electrically connected to the gate of the second transistor, and the first reset-signal input terminal and the second reset-signal input terminal are a same reset-signal input terminal; and wherein the fifth transistor, the sixth transistor, the seventh transistor and the eighth transistor have a same channel type, and the first potential-signal input terminal is reused as the first power-signal input terminal.

6. The shift register of claim 5, wherein the first transistor has the same channel type as the fifth transistor.

7. The shift register of claim 1, wherein the first node control module comprises a third transistor and a fourth transistor, wherein
a gate of the third transistor is configured as the first control terminal of the first node control module, a gate of the fourth transistor is configured as the second control terminal of the first node control module, a first electrode of the third transistor and a second electrode of the fourth transistor are electrically connected to each other and configured as the output terminal of the first node control module, a second electrode of the third transistor is configured as the first input terminal of the first node control module, and a first electrode of the fourth transistor is configured as the second input terminal of the first node control module.

8. The shift register of claim 7, wherein the voltage division module comprises a fifth transistor, a sixth transistor, a seventh transistor and an eighth transistor, wherein
a gate and a first electrode of the fifth transistor and a first electrode of the sixth transistor are configured as the first input terminal of the voltage division module, a second electrode of the fifth transistor and a first electrode of the seventh transistor are electrically connected to a gate of the sixth transistor, a second electrode of the sixth transistor and a first electrode of the eighth transistor are electrically connected to each other and configured as the output terminal of the voltage division module, a gate of the seventh transistor and a gate of the eighth transistor are electrically connected to each other and configured as the control terminal of the voltage division module, and a second electrode of the seventh transistor and a second electrode of the eighth transistor are configured as the second input terminal of the voltage division module.

9. The shift register of claim 8, wherein the fifth transistor, the sixth transistor, the seventh transistor and the eighth transistor have a same channel type, and the first potential-signal input terminal is reused as the first power-signal input terminal.

10. The shift register of claim 9, wherein the second potential-signal input terminal is reused as the second power-signal input terminal.

11. The shift register of claim 8, wherein the output module comprises a ninth transistor and a tenth transistor, wherein
a gate of the ninth transistor is configured as the first control terminal of the output module, a first electrode of the ninth transistor is configured as the first input terminal of the output module, a second electrode of the ninth transistor and a first electrode of the tenth transistor are electrically connected to each other and configured as the output terminal of the output module, a gate of the tenth transistor is configured as the second control terminal of the output module, and a second electrode of the tenth transistor is configured as the second input terminal of the output module.

12. The shift register of claim 11, wherein the second node control module comprises an eleventh transistor, wherein
a gate of the eleventh transistor is configured as the control terminal of the second node control module, a first electrode of the eleventh transistor is configured as the input terminal of the second node control module, and a second electrode of the eleventh transistor is configured as the output terminal of the second node control module.

13. The shift register of claim 12, wherein the storage module comprises a storage capacitor, wherein
a first terminal of the storage capacitor is configured as the first terminal of the storage module, and a second terminal of the storage capacitor is configured as the second terminal of the storage module.

14. A gate drive circuit, comprising cascaded shift registers, wherein each of the cascaded shift registers comprises: a first control-signal input terminal, a second control-signal input terminal, a first potential-signal input terminal, a second potential-signal input terminal, a first node, a second node, a first power-signal input terminal, a second power-signal input terminal, a clock-signal input terminal, a first reset-signal input terminal, a second reset-signal input terminal, a scanning-signal output terminal, a first node control module, a voltage division module, an output module, a second node control module, a storage module and a reset module;
wherein the first node control module comprises a first control terminal, a second control terminal, a first input terminal, a second input terminal and an output terminal, and wherein the first node control module is configured to control the first input terminal of the first node control module to communicate with the output terminal of the first node control module according to a signal inputted to the first control terminal of the first node control module, or to control the second input terminal of the first node control module to communicate with the output terminal of the first node control module according to a signal inputted to the second control terminal of the first node control module;
wherein the voltage division module comprises a first input terminal, a second input terminal, a control terminal and an output terminal, and wherein the voltage division module is configured to control a voltage of the second node to be a divided voltage of a voltage difference once between a first power signal inputted to the first power-signal input terminal and a second power signal inputted to the second power-signal input terminal;
wherein the output module comprises a first control terminal, a second control terminal, a first input terminal, a second input terminal and an output terminal, and wherein the output module is configured to output a signal of the clock-signal input terminal according to a potential of the first node, or to output a signal of the second power-signal input terminal according to a potential of the second node;
wherein the second node control module comprises a control terminal, an input terminal and an output terminal, and wherein the second node control module is configured to control the potential of the first node according to the potential of the second node;
wherein the storage module comprises a first terminal and a second terminal, wherein the first terminal of the storage module is electrically connected to the first node, and wherein the storage module is configured to maintain potentials of the first node and the scanning-signal output terminal to be in a stable state;
wherein the reset module comprises a first control terminal, a second control terminal, an input terminal, a first output terminal and a second output terminal, and the reset module is configured to reset the first node and the scanning-signal output terminal; and
wherein the first control-signal input terminal of a first-stage shift register is electrically connected to an initial-signal input terminal of the gate drive circuit, and the scanning-signal output terminal of a previous-stage shift register is electrically connected to the first control-signal input terminal of a next-stage shift register, and the scanning-signal output terminal of the next-stage shift register is electrically connected to the second control-signal input terminal of the previous-stage shift register.

15. A display panel, comprising a gate drive circuit, wherein the gate drive circuit comprises: cascaded shift registers, wherein each of the cascaded shift registers comprises: a first control-signal input terminal, a second control-signal input terminal, a first potential-signal input terminal, a second potential-signal input terminal, a first node, a second node, a first power-signal input terminal, a second power-signal input terminal, a clock-signal input terminal, a first reset-signal input terminal, a second reset-signal input terminal, a scanning-signal output terminal, a first node control module, a voltage division module, an output module, a second node control module, a storage module and a reset module;
wherein the first node control module comprises a first control terminal, a second control terminal, a first input terminal, a second input terminal and an output terminal, and wherein the first node control module is configured to control the first input terminal of the first node control module to communicate with the output terminal of the first node control module according to a signal inputted to the first control terminal of the first node control module, or to control the second input terminal of the first node control module to communicate with the output terminal of the first node control module according to a signal inputted to the second control terminal of the first node control module;
wherein the voltage division module comprises a first input terminal, a second input terminal, a control terminal and an output terminal, and wherein the voltage division module is configured to control a voltage of the second node to be a divided voltage of a voltage difference between a first power signal inputted to the first power-signal input terminal and a second power signal inputted to the second power-signal input terminal;
wherein the output module comprises a first control terminal, a second control terminal, a first input terminal, a second input terminal and an output terminal, and wherein the output module is configured to output a signal of the clock-signal input terminal according to a potential of the first node, or to output a signal of the second power-signal input terminal according to a potential of the second node;
wherein the second node control module comprises a control terminal, an input terminal and an output terminal, and wherein the second node control module is configured to control the potential of the first node according to the potential of the second node;
wherein the storage module comprises a first terminal and a second terminal, and wherein the storage module is configured to maintain potentials of the first node and the scanning-signal output terminal to be in a stable state;
wherein the reset module comprises a first control terminal, a second control terminal, an input terminal, a first output terminal and a second output terminal, and the reset module is configured to reset the first node and the scanning-signal output terminal; and wherein the first control-signal input terminal of a first-stage shift register is electrically connected to an initial-signal input terminal of the gate drive circuit, and the scanning-signal output terminal of a previous-stage shift register is electrically connected to the first control-signal input terminal of a next-stage shift register, and the scanning-signal output terminal of the next-stage shift register is electrically connected to the second control-signal input terminal of the previous-stage shift register.

* * * * *